United States Patent [19]

Chevallier

[11] Patent Number: 5,233,311
[45] Date of Patent: Aug. 3, 1993

[54] DIFFERENTIAL AMPLIFIER AND OSCILLATOR MIXER COMPRISING SAID AMPLIFIER

[75] Inventor: Gilles Chevallier, Langrune S/Mer, France

[73] Assignee: U.S. Philips Corporation, New York, N.Y.

[21] Appl. No.: 929,069

[22] Filed: Aug. 12, 1992

[30] Foreign Application Priority Data

Aug. 21, 1991 [FR] France .................. 91 10481

[51] Int. Cl.$^5$ .......................... H03F 3/45; H03B 5/00; H04B 1/28
[52] U.S. Cl. ............................ 330/252; 330/260; 330/311; 331/117 R; 455/333
[58] Field of Search .............. 330/252, 260, 311; 331/117 R; 455/313, 323, 333

[56] References Cited

U.S. PATENT DOCUMENTS 4,406,990  9/1983  Nord ..................... 330/296
5,072,194  12/1991  Chevallier ............. 330/260

FOREIGN PATENT DOCUMENTS 2640094  6/1990  France .

Primary Examiner—James B. Mullins
Attorney, Agent, or Firm—Bernard Franzblau

[57] ABSTRACT

A differential amplifier of the cascode type comprises a differential stage which includes a first ($T_1$) and a second ($T_2$) transistor whose collectors are connected to an active load constituted by the respective collector-emitter paths of a third ($T_3$) and a fourth ($T_4$) transistor in series with a first and a second resistor, respectively. One end of each resistor is connected to a supply voltage terminal. The third and the fourth transistor have their bases connected to a reference voltage terminal. A first capacitor ($C_1$) is coupled between the collector-emitter paths of the third and of the first transistor, and a second capacitor ($C_2$) is arranged between the collector-emitter paths of the fourth and of the second transistor. A third ($R'_1$) and a fourth ($R'_2$) resistor are connected between the supply voltage terminal ($V_{cc}$) and the collector-emitter path of the first transistor and of the second transistor, respectively.

8 Claims, 2 Drawing Sheets

DIFFERENTIAL AMPLIFIER AND OSCILLATOR MIXER COMPRISING SAID AMPLIFIER

BACKGROUND OF THE INVENTION

This invention relates to a differential amplifier of the cascode type comprising a differential stage which comprises a first and a second transistor whose collector-emitter paths are connected to an active load and whose bases are connected to inputs of the differential amplifier, the active load comprising a third and a fourth transistor whose collector-emitter paths are connected to a first supply voltage terminal via a first resistor and a second resistor respectively and whose bases are connected to a reference voltage terminal.

Such amplifiers are widely known and used. A problem with these amplifiers is the relationship between linearity and supply voltage. For a given supply voltage it may be desirable to improve the linearity or, conversely, for a given linearity it may be desirable to reduce the supply voltage. Applicant's French Patent 2,640,094, filed on 6 Dec. 1988, proposes a solution to this problem.

SUMMARY OF THE INVENTION

It is an object of the invention to improve the operation of amplifiers of the above type.

The basic idea is to provide a different amplifier operation for direct current and for alternating current.

Thus, a differential amplifier in accordance with the invention is characterised in that it comprises a first capacitor, arranged between the collector-emitter paths of the third transistor and of the first transistor, and a second capacitor, arranged between the collector-emitter paths of the fourth transistor and of the second transistor, in that it comprises a third resistor and a fourth resistor, arranged between the first supply voltage terminal and the collector-emitter path of the first transistor and of the second transistor, respectively, and in that it comprises a first and a second current source connected to the collector-emitter path of the third transistor and the fourth transistor respectively to supply a current to the third transistor and to the fourth transistor. Said current sources may comprises a fifth resistor and a sixth resistor connected between the collector-emitter path of the third transistor and of the fourth transistor, respectively, and a second supply voltage source (for example, ground).

The invention also relates to an oscillator-mixer comprising a mixer driving the inputs of a differential amplifier as defined above, and having its outputs connected to a filter. Suitably, the mixer is coupled directly to the inputs of the differential amplifier. In a preferred embodiment the mixer is coupled to the outputs of the differential amplifier only via a first and a second feedback resistor.

BRIEF DESCRIPTION OF THE DRAWING

The invention will now be described in more detail, by way of non-limitative example, with reference to the accompanying drawings, in which.

DESCRIPTION OF THE PREFERRED EMBODIMENTS

Figure 1:
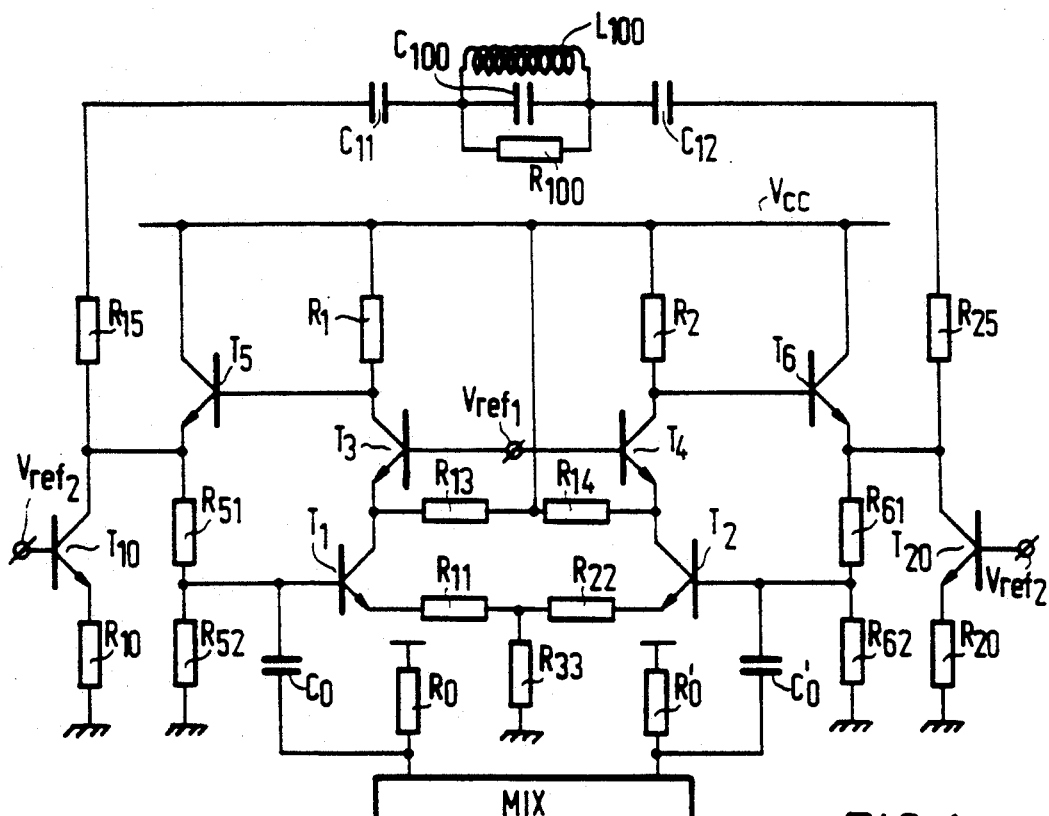
FIG. 1 shows an oscillator-mixer in accordance with said French Patent 2,640,094.

In FIG. 1 an amplifier suitable for use as an IF amplifier for the signals from a mixer (MIX, $R_0$, $C_0$, $R'_0$, $C'_0$) comprises two transistors $T_1$ and $T_2$ forming a differential pair, the emitters of the transistors being connected by two resistors $R_{11}$ and $R_{22}$ in series, and a current source (specifically a resistor $R_{33}$), the current source being connected to the node common to $R_{11}$ and $R_{22}$. The cascode transistors $T_3$ and $T_4$, whose bases are interconnected and are brought to the reference potential $V_{ref1}$, have their collector-emitter paths arranged between the collector-emitter paths of $T_1$ and $T_2$, respectively and a supply voltage terminal $V_{cc}$. Current sources ($R_{13}$, $R_{14}$) separately supply a part of the steady-state current of the differential pair ($T_1$, $T_2$).

Transistors $T_5$ and $T_6$ are arranged as emitter-followers, their bases being connected to the collectors of the transistors $T_3$ and $T_4$ respectively. The collectors of $T_5$ and $T_6$ are connected to the supply voltage terminal $V_{cc}$. The emitters of $T_5$ and $T_6$ are connected to a current source ($R_{10}$, $T_{10}$) and $R_{20}$, $T_{20}$) respectively, for which purpose the transistors $T_{10}$ and $T_{20}$ have their bases connected to a reference voltage terminal $V_{ref2}$. In order to obtain a transimpedance amplifier feedback is provided by means of two resistive divider bridges ($R_{51}$, $R_{52}$) and ($R_{61}$, $R_{62}$). The first divider bridge ($R_{51}$, $R_{52}$) is arranged between the emitter of $T_5$ and a second supply voltage terminal (common-mode terminal). The second divider bridge ($R_{61}$, $R_{62}$) is arranged between the emitter of $T_6$ and the second supply voltage terminal.

The filter of the amplifier is constituted by a parallel circuit $L_{100}$, $C_{100}$ $R_{100}$ connected to the emitters of $T_5$ and $T_6$ via two resistors $R_{15}$ and $R_{25}$ and two capacitors $C_{11}$ and $C_{12}$.

Figure 2:
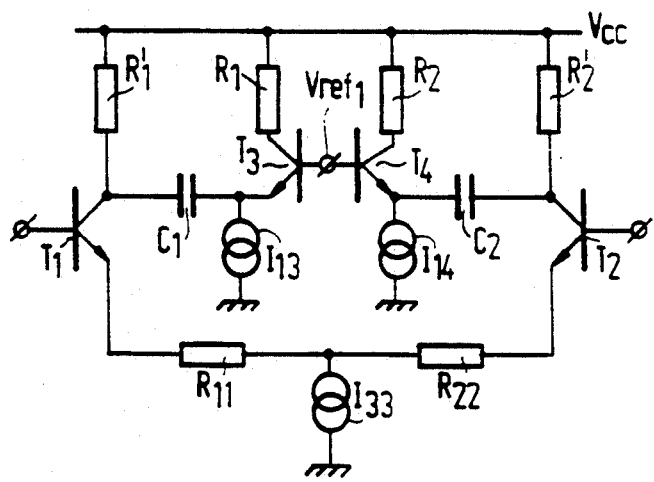
FIG. 2 shows a differential amplifier in accordance with the invention.

In FIG. 2 an amplifier in accordance with the invention, in the same way as that in FIG. 1, comprises a differential pair ($T_1$, $T_2$, $R_{11}$, $R_{22}$, $I_{33}$ ($R_{33}$)) and cascode transistors $T_3$ and $T_4$ whose bases are interconnected and are brought to the voltage $V_{ref1}$. The collectors of $T_3$ and $T_4$ are connected to the supply voltage terminal Vcc via resistors $R_1$ and $R_2$. The collectors of $T_1$ and $T_2$ are connected to the supply voltage terminal Vcc via resistors $R'_1$ and $R'_2$.

Current sources ($I_{13}$ ($R_{13}$), $I_{14}$ ($R_{14}$)) are arranged in the emitters of $T_3$ and $T_4$ respectively to supply a current to $T_3$ and $T_4$. It is to be noted that the currents are directed oppositely to those supplied by the resistors $R_{13}$ and $R_{14}$ in the prior-art amplifier. The currents are bias currents whose values are non-critical.

The collector-emitter paths of $T_3$ and $T_4$ are connected in series with those of the transistors $T_1$ and $T_2$ via capacitors $C_1$ and $C_2$ respectively.

When the impedances of the capacitors $C_1$ and $C_2$ are sufficiently low the Miller effect of the transistors $T_1$ and $T_2$ decreases in the same way as in a conventional cascode amplifier.

On the other hand, as a result of the presence of the capacitors $C_1$ and $C_2$, in the case of direct current operation, the collector of $T_1$ (or of $T_2$) will be at a higher potential than the emitter of $T_3$ (or of $T_4$). In other words, if all the other conditions are the same, the supply voltage $V_{cc}$ can be smaller than in a conventional cascode arrangement, in which allowance is to be made for the two collector-emitter paths in series. In accordance with the invention the transistors of the differential pair and the cascode transistors may be said to operate "in series" for alternating current and "in parallel" for the d.c. bias.

If the supply voltage $V_{cc}$ remains the same, the values of the resistors $R'_1$ and $R'_2$ can be reduced in comparison with the prior art (because the collectors of $T_1$ and $T_2$ can be at a higher potential than before). This results in the transistors $T_3$ and $T_4$ being biassed in such a way that collector-emitter voltages are higher than before and, consequently, an improved linearity can be obtained. Moreover, $R_{33}$ may be replaced by a current source $I_{33}$, making it possible to achieve a substantially perfect rejection of common-mode signals.

Finally, the amplifier has a different d.c. and a.c. gain. The d.c. gain $G_{DC}$ is $$G_{DC} = \frac{R'_1}{R_{11}} = \frac{R'_2}{R_{22}}.$$

The a.c. gain $G_{AC}$ is $$G_{AC} = \frac{R_1}{R_{11}} = \frac{R_2}{R_{22}}.$$

Since the value of $R'_1$ and of $R'_2$ has been reduced advantageously as indicated above, it is easy to obtain a distinctly smaller value for $G_{DC}$ than for $G_{AC}$, which makes it possible to dispense with the feedback of the amplifier for direct current, the offset voltages at the input being no longer annoying.

Figure 3:
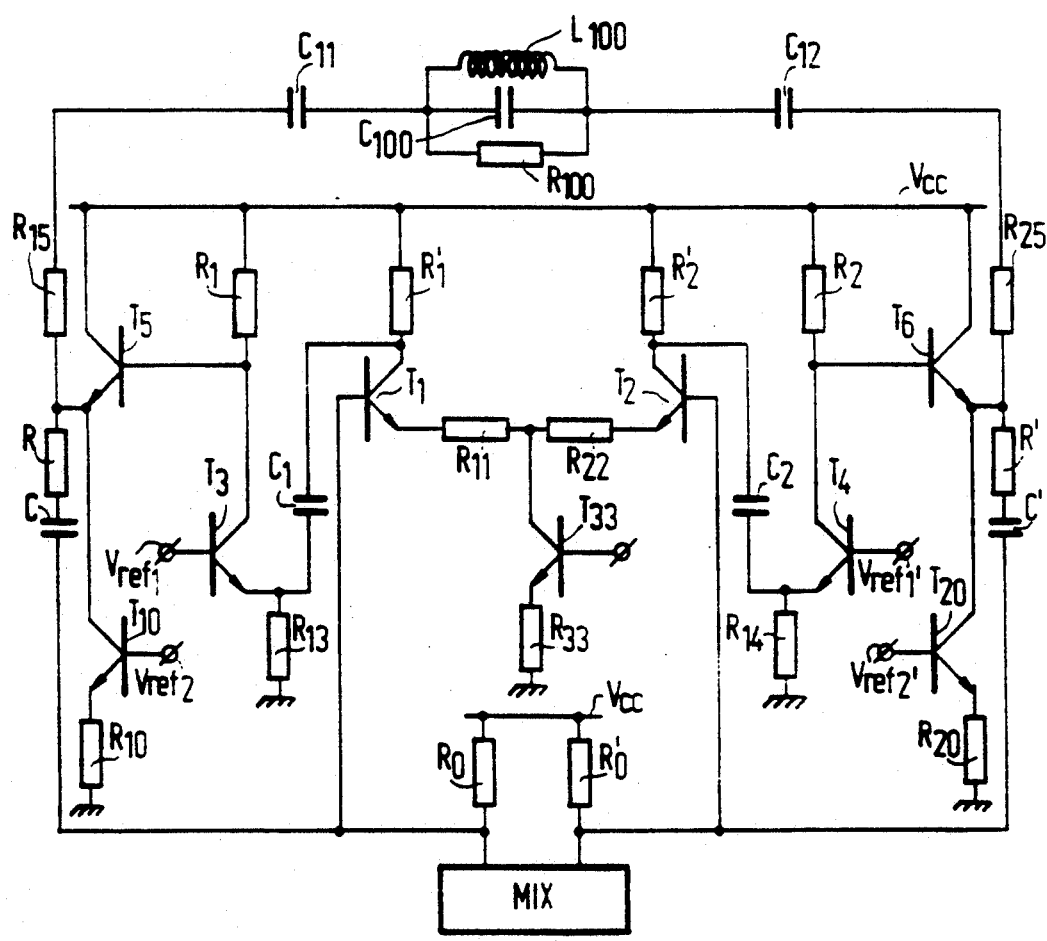
FIG. 3 shows an oscillator-mixer in accordance with the invention.

In FIG. 3 the current sources $I'_{13}$ and $I'_{14}$ comprise resistors $R'_{13}$ and $R'_{14}$ connected between the emitters of $T_3$ and $T_4$ respectively and ground. It is to be noted that the emitter voltage of $T_3$ and $T_4$ is comparatively constant because it only differs from $V_{ref1}$ by the base-emitter voltage of $T_3$ and $T_4$, which varies little as a function of the current through the transistor.

In the same way as in FIG. 1, there are provided transistors $T_5$ and $T_6$, resistors $R_{15}$ and $R_{25}$, and current sources ($R_{10}$, $T_{10}$) and ($R_{20}$, $T_{20}$). The d.c. feedback resistors ($R_{51}$, $R_{52}$) and ($R_{61}$, $R_{62}$) have been dispensed with for the reasons already mentioned. The mixer MIX is coupled directly to the bases of the transistors $T_1$ and $T_2$. This is possible owing to the above-mentioned reduction of the value of $R'_1$ and $R'_2$, which enables the offset voltages at the amplifier input to be reduced, as a result of which a d.c. feedback is not necessary. The mixer is coupled to the outputs of the amplifier (emitters of the transistors $T_5$ and $T_6$) by a resistor in series with a capacitor, (R, C) for $T_5$ and (R', C') for $T_6$. In general, C and C' can be of the order of 10 pF, which means that the capacitors can be integrated (see European Patent Application EP 414,328, which corresponds to U.S. Pat. No. 5,072,194).

Figure 4:
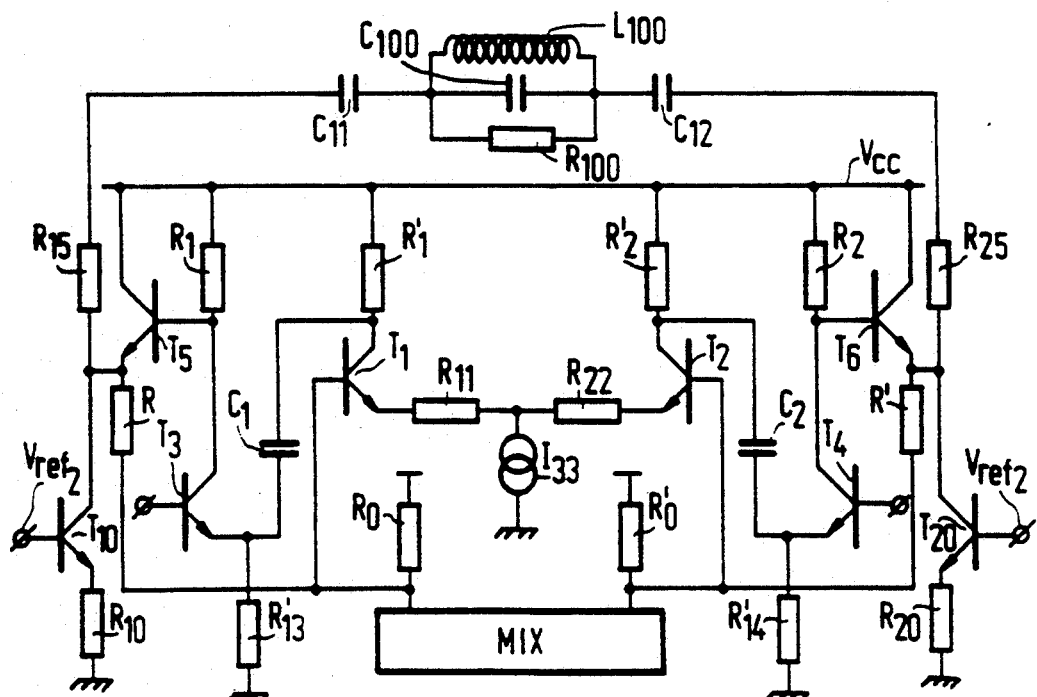
FIG. 4 shows a preferred embodiment of an oscillator-mixer in accordance with the invention.

FIG. 4 shows a direct coupling. It is desirable to dispense with the capacitors C and C' for the mere reason of the area they occupy in an integrated circuit. Another reason is the risk of oscillation at very low frequency when the filter ($R_{100}$, $L_{100}$, $C_{100}$) is not connected. In FIG. 4 the coupling is provided directly by feedback resistors R and R' between the mixer and the outputs of the amplifier. To achieve this, the voltage drop is compensated for by increasing the currents of the current sources ($R_{10}$, $T_{10}$) and ($R_{20}$, $T_{20}$) by a value $\Delta I$ equal to $$\Delta I = \frac{V_A - V_D}{R},$$

$V_A$ being the potential on the base of the transistor $T_1$ for direct current, and $V_D - V_A$ being the voltage drop across the feedback resistor (R or R').

It is also advisable to reduce the values of the resistors $R_0$ and $R'_0$ to maintain the voltages equal:

$$R_M = R_0 \frac{I_M}{I_M + \Delta I}$$

$R_M$ being the new value of the resistor $R_0$, respectively the resistor $R_0'$, and $I_M$ being the current through the resistor $R_0$, respectively the resistor $R_0'$ in the case of FIG. 3.

I claim:

1. A differential amplifier of the cascode type comprising: a differential stage which comprises a first and a second transistor whose collector-emitter paths are connected to an active load and whose bases are connected to inputs of the differential amplifier, the active load comprising a third and a fourth transistor whose collector-emitter paths are connected to a first supply voltage terminal via a first resistor and a second resistor, respectively, and whose bases are connected to a reference voltage terminal, characterised in that a first capacitor is coupled between the collector-emitter paths of the third transistor and of the first transistor, and a second capacitor is coupled between the collector-emitter paths of the fourth transistor and of the second transistor, a third resistor and a fourth resistor coupled between the first supply voltage terminal and the collector-emitter path of the first transistor and of the second transistor, respectively, and a first and a second current source connected to the collector-emitter path of the third transistor and the fourth transistor, respectively, to supply a current to the third transistor and to the fourth transistor.

2. A differential amplifier as claimed in claim 1, wherein the first and second current source comprise a fifth and a sixth resistor connected between the collector emitter path of the third transistor and of the fourth transistor respectively, and a second supply voltage terminal.

3. An oscillator-mixer comprising a mixer driving the inputs of a differential amplifier having its outputs connected to a filter, wherein the differential amplifier includes an amplifier as claimed in claim 2.

4. An oscillator-mixer comprising a mixer driving the inputs of a differential amplifier having its outputs connected to a filter, wherein the differential amplifier includes an amplifier as claimed in claim 1.

5. An oscillator-mixer as claimed in claim 4, wherein the mixer is coupled directly to the input of the differential amplifier.

6. An oscillator-mixer as claimed in claim 5, wherein the mixer is coupled to outputs of the differential amplifier only via a first and a second feedback resistor.

7. An oscillator-mixer as claimed in claim 6, wherein a fifth transistor and a sixth transistor connected as emitter followers have their bases connected to a first point and a second point, respectively, the first point being connected between the collector-emitter path of the third transistor and the first resistor, and the second point being connected between the collector-emitter path of the fourth transistor and the second resistor.

8. An oscillator-mixer as claimed in claim 4, wherein a fifth transistor and a sixth transistor connected as emitter followers and have their bases connected to a first point and a second point, respectively, the first point being connected between the collector-emitter path of the third transistor and the first resistor, and the second point being connected between the collector-emitter path of the fourth transistor and the second resistor.

* * * * *

UNITED STATES PATENT AND TRADEMARK OFFICE
CERTIFICATE OF CORRECTION

PATENT NO. : 5,233,311
DATED : August 3, 1993
INVENTOR(S) : Gilles Chevallier

It is certified that error appears in the above-indentified patent and that said Letters Patent is hereby corrected as shown below:

IN THE ABSTRACT
line 12, change "arranged" to --coupled--.

Column 2, line 37, change "$C_{100}$" to --$C_{100}$,--.

IN THE CLAIMS
Claim 2, column 4, line 47, after "transistor" insert --,-- (comma).

Claim 8, column 5, line 5, delete "and".

Signed and Sealed this

Sixteenth Day of May, 1995

Attest:

Attesting Officer

BRUCE LEHMAN

Commissioner of Patents and Trademarks